(12) United States Patent
Sasaki et al.

(10) Patent No.: US 11,785,738 B2
(45) Date of Patent: Oct. 10, 2023

(54) ELECTRONIC APPARATUS

(71) Applicant: Sony Interactive Entertainment Inc., Tokyo (JP)

(72) Inventors: Ichiro Sasaki, Chiba (JP); Keiichi Aoki, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 603 days.

(21) Appl. No.: 16/981,176

(22) PCT Filed: Mar. 15, 2019

(86) PCT No.: PCT/JP2019/010945
§ 371 (c)(1),
(2) Date: Sep. 15, 2020

(87) PCT Pub. No.: WO2019/181804
PCT Pub. Date: Sep. 26, 2019

(65) Prior Publication Data
US 2021/0007239 A1    Jan. 7, 2021

(30) Foreign Application Priority Data
Mar. 22, 2018 (JP) ................. 2018-055134

(51) Int. Cl.
*H05K 7/20* (2006.01)
*H05K 7/14* (2006.01)

(52) U.S. Cl.
CPC ....... *H05K 7/20127* (2013.01); *H05K 7/1417* (2013.01)

(58) Field of Classification Search
CPC .................................................. H05K 7/20127
See application file for complete search history.

(56) References Cited

U.S. PATENT DOCUMENTS 7,903,405 B1 * 3/2011 Miller ................ H05K 7/20145
361/689
8,934,241 B2 1/2015 Kaneko
(Continued)

FOREIGN PATENT DOCUMENTS

JP 06125187 A 5/1994
JP 2008010769 A 1/2008
(Continued)

OTHER PUBLICATIONS

Decision to Grant a Patent for corresponding JP Application No. 2020-507764, 4 pages, dated Mar. 11, 2022.
(Continued)

*Primary Examiner* — Hung V Ngo
(74) *Attorney, Agent, or Firm* — Matthew B. Dernier, Esq.

(57) ABSTRACT

Proposed is an electronic apparatus with which it is possible to increase design freedom concerning a wall section formed with vent holes. A rear wall section (20D) includes a rectilinear wall section (21*i*) spaced rearward from a rear edge (41*c*) of a circuit board (41), and an inclined wall section (21*j*) located on the rear side relative to the rectilinear wall section (21*i*). An inner wall section (42*e*) is located between the inclined wall section (21*j*) and the rear edge (41*c*) of the circuit board (41), and is not located between the rectilinear wall section (21*i*) and the rear edge (41*c*) of the circuit board (41).

5 Claims, 10 Drawing Sheets

(56) References Cited

U.S. PATENT DOCUMENTS

| | | | |
|---|---|---|---|
| 9,832,908 B2 | 11/2017 | Tetsu | |
| 2012/0069520 A1 | 3/2012 | Kaneko | |
| 2014/0362529 A1* | 12/2014 | Tsuchida | ............ H05K 7/20127 |
| | | | 361/690 |
| 2016/0120061 A1 | 4/2016 | Tetsu | |
| 2019/0132969 A1 | 5/2019 | Hirose | |
| 2021/0120700 A1* | 4/2021 | Mito | .................. H05K 7/20145 |

FOREIGN PATENT DOCUMENTS

| | | | |
|---|---|---|---|
| JP | 2012069685 A | 4/2012 | |
| JP | 2013222775 A | 10/2013 | |
| JP | 2014123678 A | 7/2014 | |
| JP | 2017183670 A | 7/2014 | |
| WO | 2014185310 A1 | 11/2014 | |
| WO | 2017169169 A1 | 10/2017 | |

OTHER PUBLICATIONS

International Search Report for corresponding PCT Application No. PCT/JP2019/010945, 2 pages, dated May 28, 2019.
International Preliminary Report on Patentability and Written Opinion for corresponding PCT Application No. PCT/JP2019/010945, 11 pages, dated Oct. 1, 2020.

\* cited by examiner

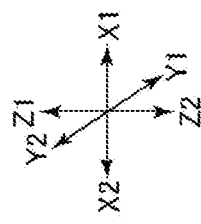
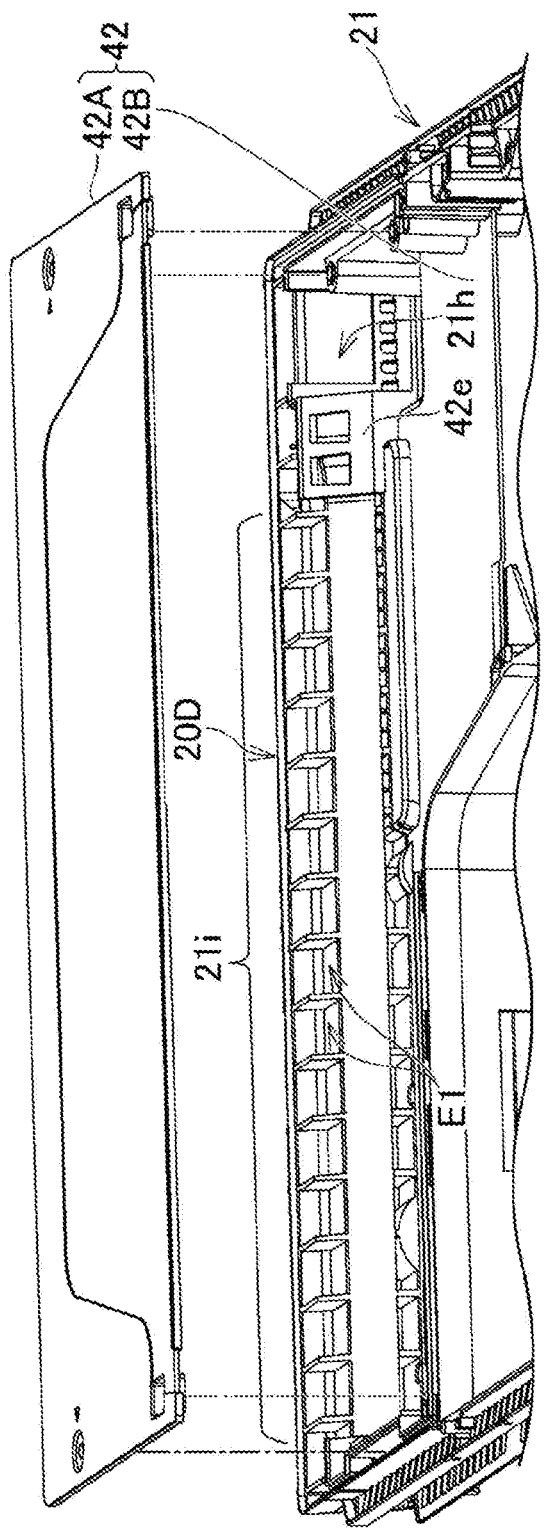

ELECTRONIC APPARATUS

TECHNICAL FIELD

The present disclosure relates to an electronic apparatus.

BACKGROUND ART

An electronic apparatus of PTL 1 below has an air flow path for cooling a microprocessor mounted on a main substrate and parts mounted to a power source circuit. An armor member of the electronic apparatus is formed with intake holes and exhaust holes located at end portions of the air flow path. A plurality of the intake holes is formed in a side wall of the armor member, and a plurality of the exhaust holes is formed in a rear wall of the armor member (In the following, both the intake holes and the exhaust holes will be referred to as vent holes.). Along the wall sections provided with the vent holes, the parts such as the circuit board are located.

CITATION LIST

Patent Literature

[PTL 1] JP 2017-183670A

SUMMARY

Technical Problems

A designer of an electronic apparatus may desire to curve or incline a wall section formed with vent holes (hereinafter referred to as a vent hole wall), for the purpose of enhancing the appearance and functionality of the electronic apparatus. However, for example, if a part of the vent hole wall is inclined such as to be bulged toward the outside, the distance between the circuit board disposed inside the armor member and the inclined part of the vent hole wall would be larger than the distance between other part of the vent hole wall and the circuit board. This may make it difficult to adopt a design in which the vent hole wall is inclined. For example, since an airflow is changed when a part of the vent hole wall is inclined, it may be difficult to adopt a design in which a part of the vent hole wall is inclined. In addition, in the case where a part (for example, electric wire) attached to the circuit board is supported by the vent hole wall, such a support structure cannot be realized at the inclined part of the vent hole wall, so that it may be difficult to adopt a design in which a part of the vent hole wall is inclined.

One of the objects of the present disclosure is to propose an electronic apparatus with which it is possible to increase design freedom concerning a wall section formed with vent holes.

Solution to Problems

An example of an electronic apparatus proposed in the present disclosure includes a circuit board, and an armor member having a vent hole wall that is located in a first direction relative to the circuit board and that is formed with a plurality of vent holes. The circuit board has an edge along the vent hole wall, on the side of the vent hole wall. The vent hole wall includes a first wall section spaced in the first direction from the edge of the circuit board, and a second wall section located in the first direction relative to the first wall section. An inner wall section is located between the second wall section and the edge of the circuit board. The inner wall section is not located between at least a part of the first wall section and the edge of the circuit board. According to this electronic apparatus, since the inner wall section is located between the second wall section and the edge of the circuit board, limitations on design due to the enlargement of the distance between the second wall section and the edge of the circuit board can be mitigated. As a result, it is possible to increase design freedom concerning the wall section formed with the vent holes.

BRIEF DESCRIPTION OF DRAWINGS

FIG. 8 is a perspective view depicting the armor frame and the lower case of the power source unit.

DESCRIPTION OF EMBODIMENT

Figure 1:
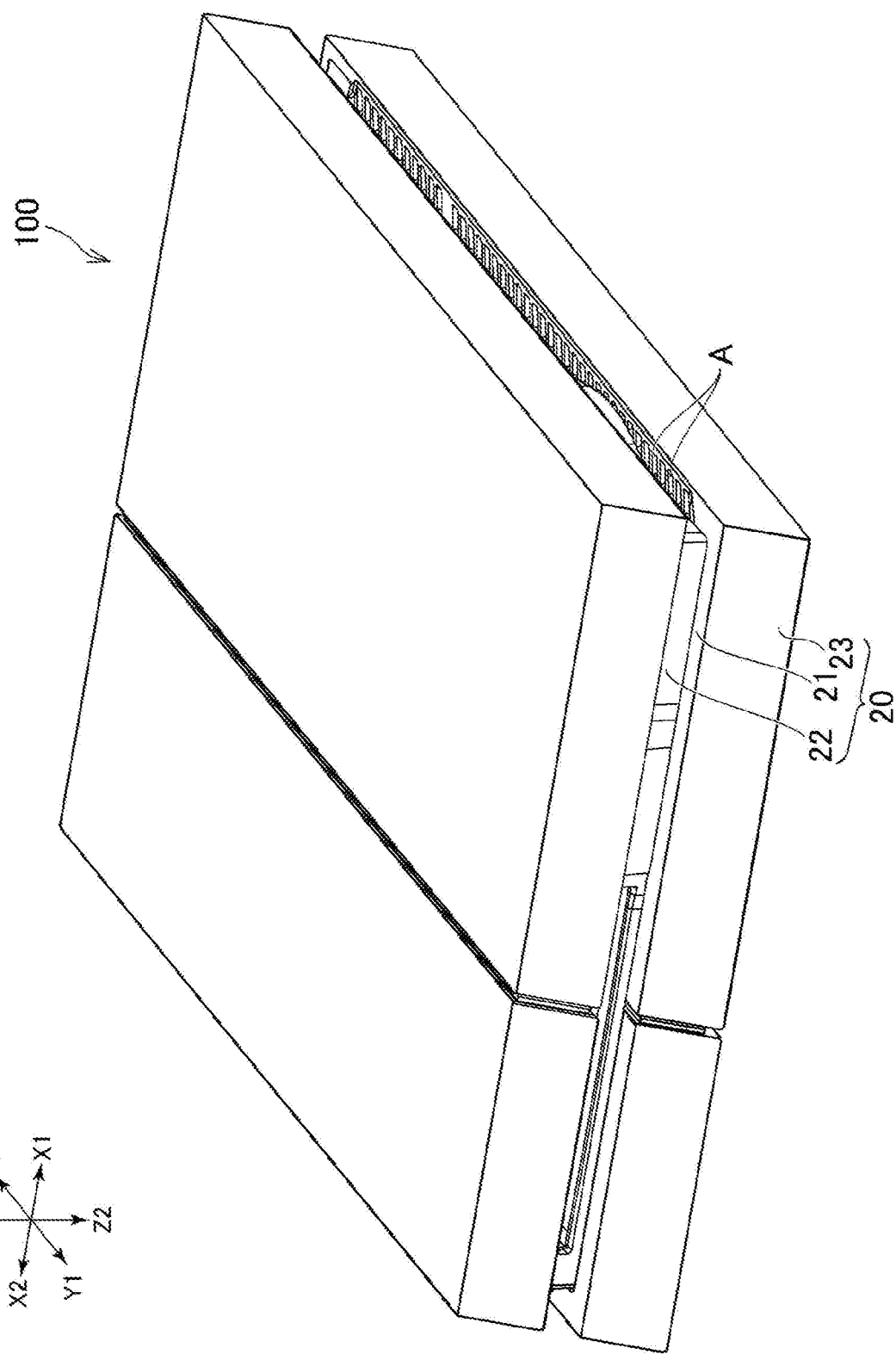
FIG. 1 is a perspective view depicting an example of an electronic apparatus proposed in the present disclosure.

An example of an embodiment of an electronic apparatus proposed in the present disclosure will be described below. In the following description, Y1 and Y2 directions depicted in FIG. 1 and the like will be referred to respectively as a forward direction and a rearward direction, X1 and X2 directions will be referred to respectively as a rightward direction and a leftward direction, and Z1 and Z2 directions will be referred to as an upward direction and a downward direction.

An electronic apparatus 100 is, for example, an entertainment device functioning as a game device or an audio-visual apparatus. The electronic apparatus 100 outputs moving image data generated by execution of a game program, video-audio data acquired from a recording medium such as an optical disk, video-audio data acquired through a network and the like to a display device such as a television. The electronic apparatus proposed in the present disclosure is not limited to the entertainment device such as a game device, and may be a personal computer.

Figure 2:
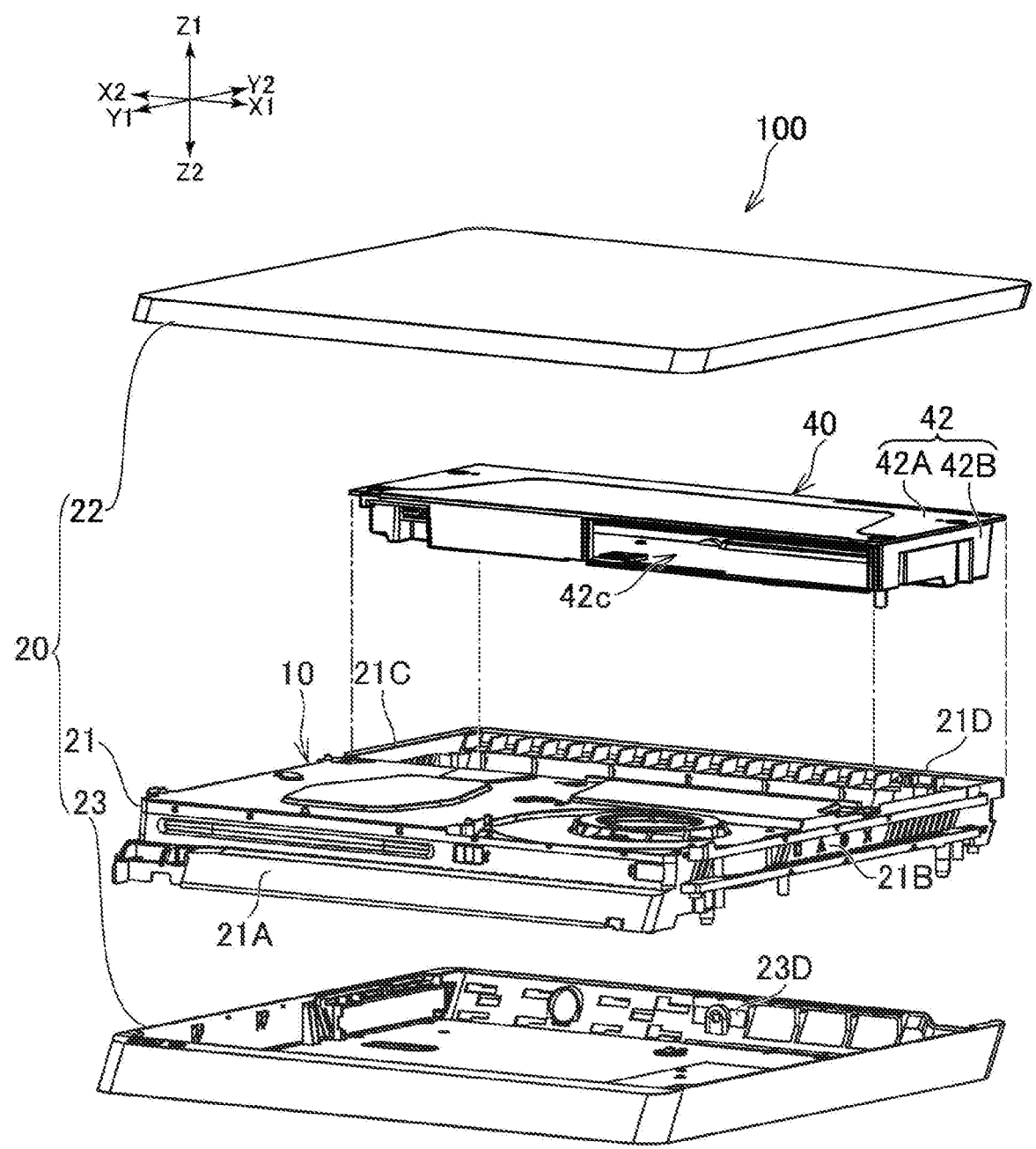
FIG. 2 is an exploded perspective view of the electronic apparatus.

As illustrated in FIG. 2, the electronic apparatus 100 has an apparatus main body 10. The apparatus main body 10 has such parts as a circuit board (not illustrated), a cooling fan 5 (see FIG. 3), an optical disk drive 7 (see FIG. 3), and a power source unit 40. The power source unit 40 is located at a rear portion of the apparatus main body 10, and is disposed on a rear side of the cooling fan 5 and the optical disk drive 7. The circuit board is disposed, for example, on a lower side of the cooling fan 5 and the optical disk drive 7. The layout of the parts in the apparatus main body 10 is not limited to that in the example of the electronic apparatus 100, and may be modified, as required.

As depicted in FIG. 2, the electronic apparatus 100 has an upper armor cover 22, a lower armor cover 23, and an armor frame 21 as an armor member 20 thereof. The armor frame 21 is substantially tetragonal in shape in plan view. The inside of the armor frame 21 is opening in the vertical direction, and the aforementioned parts constituting the apparatus main body 10 are supported inside the armor frame 21. In other words, the armor frame 21 has a front wall section 21A, a right wall section 21B, a left wall section 21C, and a rear wall section 21D. The parts constituting the apparatus main body 10 are disposed inside the wall sections 21A to 21D, and are attached to the armor frame 21. The upper armor cover 22 covers the upper side of the apparatus main body 10, and is attached to the armor frame 21. The lower armor cover 23 covers the lower side of the apparatus main body 10, and is attached to the armor frame 21. The upper armor cover 22, the lower armor cover 23, and the armor frame 21 are formed from a resin such as, for example, ABS (Acrylonitrile-Butadiene-Styrene) resin. Note that the configuration of the armor member 20 is not limited to that in the example of the electronic apparatus 100. For example, the electronic apparatus 100 may have a lower housing and an upper housing combined with each other in the vertical direction. Besides, the parts constituting the apparatus main body 10 may be attached to one of the housings.

[Exhaust Holes]

The electronic apparatus 100 has an air flow path for cooling a heat generating part or parts possessed by the apparatus main body 10. The heat generating part or parts are, for example, integrated circuits such as a CPU (Central Processing Unit) and a GPU (Graphics Processing Unit) mounted on the circuit board (not illustrated), and a power source circuit possessed by the power source unit 40. As depicted in FIG. 5, the armor member 20 has exhaust holes E1 and E2 for discharging air having passed through the air flow path to the exterior. In the example of the electronic apparatus 100, the exhaust holes E1 and E2 are formed in a rear wall section 20D (vent hole wall, see FIG. 4) of the armor member 20.

Figure 7:
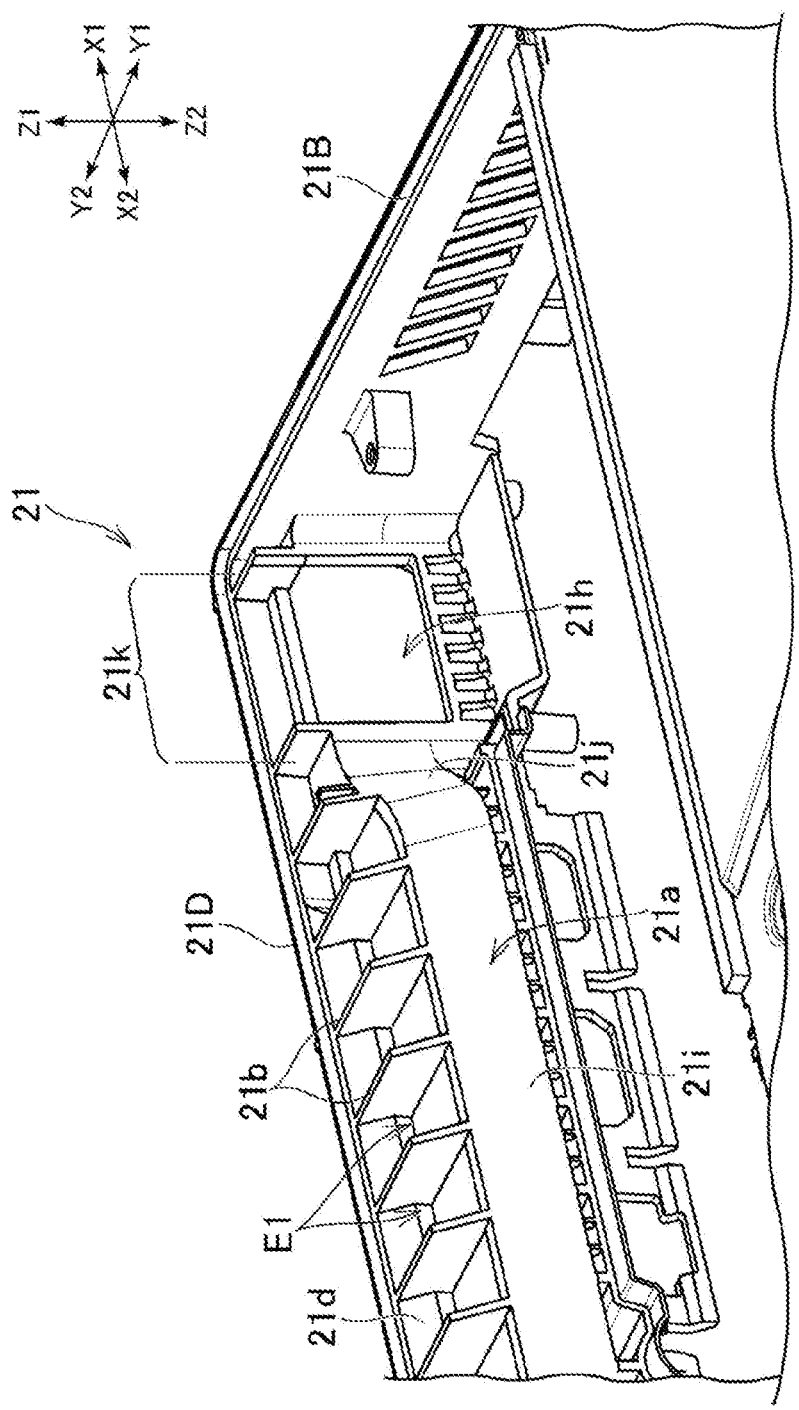
FIG. 7 is a perspective view of the armor frame.

In detail, as illustrated in FIG. 5, the rear wall section 20D of the armor member 20 includes a first wall section 21a formed along the left-right direction, and a second wall section 20b formed along the left-right direction. The second wall section 20b is spaced rearward from the first wall section 21a, and is deviated upward relative to the first wall section 21a. Between the first wall section 21a and the second wall section 20b, there is formed a plurality of exhaust holes E1 (see FIG. 7) which is aligned in the left-right direction. As depicted in FIG. 7, between the adjacent two exhaust holes E1, a partition wall section 21b partitioning them is formed. A plurality of partition wall sections 21b is aligned at regular intervals in the left-right direction. As illustrated in FIG. 5, the partition wall section 21b extends forward from the second wall section 20b, and is connected to an upper edge of the first wall section 21a. A lower edge of the second wall section 20b and an upper edge of the first wall section 21a are located at the same height. Therefore, exposure of the inside of the electronic apparatus 100 through the exhaust holes E1 is shielded by the second wall section 20b. In the example of the electronic apparatus 100, the first wall section 21a and the second wall section 20b are inclined such that their upper edges are located on the rear side relative to their lower edges. The first wall section 21a and the second wall section 20b may be formed vertical.

As depicted in FIG. 5, the rear wall section 20D of the armor member 20 has a third wall section 23a formed along the left-right direction. The third wall section 23a is spaced rearward from the first wall section 21a, and is deviated downward relative to the first wall section 21a. Between the first wall section 21a and the third wall section 23a, there is formed a plurality of exhaust holes E2 which is aligned in the left-right direction. Between the adjacent two exhaust holes E2, a partition wall section 21c partitioning them is formed. A plurality of partition wall sections 21c is aligned at regular intervals in the left-right direction. According to this structure, the exhaust holes E1 and the exhaust holes E2 face each other in the vertical direction. In the example of the electronic apparatus 100, the first wall section 21a and the third wall section 23a have substantially the same length in the left-right direction. Like the first wall section 21a and the second wall section 20b, the third wall section 23a is inclined such that its upper edge is located on the rear side relative to its lower edge. The third wall section 23a may be formed vertical.

The aforementioned wall sections 21a, 20b, 23a, 21b, and 21c constituting the exhaust holes E1 and E2 may be formed in any member of the armor frame 21, the upper armor cover 22, and the lower armor cover 23. For example, the wall sections 21a, 20b, 23a, 21b, and 21c may all be formed in the armor frame 21. In another example, the second wall section 20b and the partition wall section 21b may be formed in the upper armor cover 22, whereas the third wall section 23a and the partition wall section 21c may be formed in the lower armor cover 23. The structures of the exhaust holes E1 and E2 are also not limited to those in the example of the electronic apparatus 100. For example, the electronic apparatus may have a plurality of exhaust holes aligned in the vertical direction, and may have a partition wall section that partitions the two exhaust holes adjacent to each other in the vertical direction.

As illustrated in FIG. 5, in the example of the electronic apparatus 100, the first wall section 21a and the partition wall sections 21b and 21c are formed at the rear wall section 21D of the armor frame 21. The second wall section 20b spaced rearward from the first wall section 21a includes a wall section 21d formed at the rear wall section 21D of the armor frame 21, and a rear wall section 22D of the upper armor cover 22 disposed along the rear side of the wall section 21d. The third wall section 23a is an upper portion of a rear wall section 23D of the lower armor cover 23 spaced rearward from the first wall section 21a.

[Power Source Unit]

As depicted in FIG. 5, the power source unit 40 is disposed along the rear wall section 21D (see FIG. 2) of the armor frame 21 and the rear wall section 20D of the armor member 20 including the aforementioned second wall section 20b and the like. The power source unit 40 converts electric power supplied from an external power source into driving voltages for the parts and devices possessed by the electronic apparatus 100, and supplies the driving voltages to the parts and devices. The power source unit 40 includes a circuit board 41 (see FIG. 5) on which a power source circuit is mounted, and a case 42 (see FIG. 2) that accommodates the circuit board 41. Various parts 41b that generate heat are mounted on the circuit board 41. The case 42 is formed from a resin such as, for example, ABS resin.

As illustrated in FIG. 5, the case 42 is box-shaped, and has an upper case 42A and a lower case 42B. The upper case 42A and the lower case 42B are combined together in the vertical direction by fixing means such as, for example, screws. The case 42 is formed with an opening 42c (see FIG. 2) on the front side. The case 42 configures an air flow path S3, and, when the cooling fan 5 is driven, air going from the cooling fan 5 flows through the opening 42c into the case 42 (see FIG. 3). The rear side of the case 42 is also opening, and the case 42 (air flow path) is connected to the exhaust holes E1 and E2. As depicted in FIG. 5, the upper case 42A has an upper wall section 42a, while the lower case 42B has a lower wall section 42b. The upper wall section 42a extends to an upper edge of the second wall section 20b (more specifically, the wall section 21d of the armor frame 21). In addition, the armor frame 21 has a bottom wall section 21f formed along the left-right direction, at a lower edge of the partition wall section 21c on the lower side. A rear edge of the bottom wall section 21f reaches the third wall section 23a (an upper portion of the rear wall section 23D of the lower armor cover 23). A rear edge 42h of the lower wall section 42b of the lower case 42B is connected to a front edge of the bottom wall section 21f of the armor frame 21. Besides, left and right wall sections of the case 42 are connected to wall sections located at end portions of the exhaust holes E1 and E2. In this way, the air flow path S3 inside the case 42 is connected to the exhaust holes E1 and E2. Air in the third air flow path S3 is discharged to the exterior via the exhaust holes E1 and E2, without leaking to other regions.

The circuit board 41 is rectangular in shape, and, as depicted in FIG. 5, its rear edge 41c is located along the rear wall section 20D of the armor member 20 in which the aforementioned exhaust holes E1 and E2 are formed. More in detail, the rear edge 41c of the circuit board 41 is parallel to the rear wall section 20D. The first wall section 21a is located nearer to the circuit board 41 than the other wall sections 20b and 23a. The rear edge 41c of the circuit board 41 is parallel to the first wall section 21a (see FIG. 6). As aforementioned, the case 42 is opening to the rear side. Therefore, as illustrated in FIG. 5, between the circuit board 41 and the rear wall section 20D (more specifically, the first wall section 21a), no other part is present. In other words, a straight line along the front-rear direction that passes through the parts 41b constituting the power source circuit 41 does not intersect any part, between the rear edge 41c of the circuit board 41 and the rear wall section 20D.

[Rear Wall Section of Armor Member]

Figure 4:
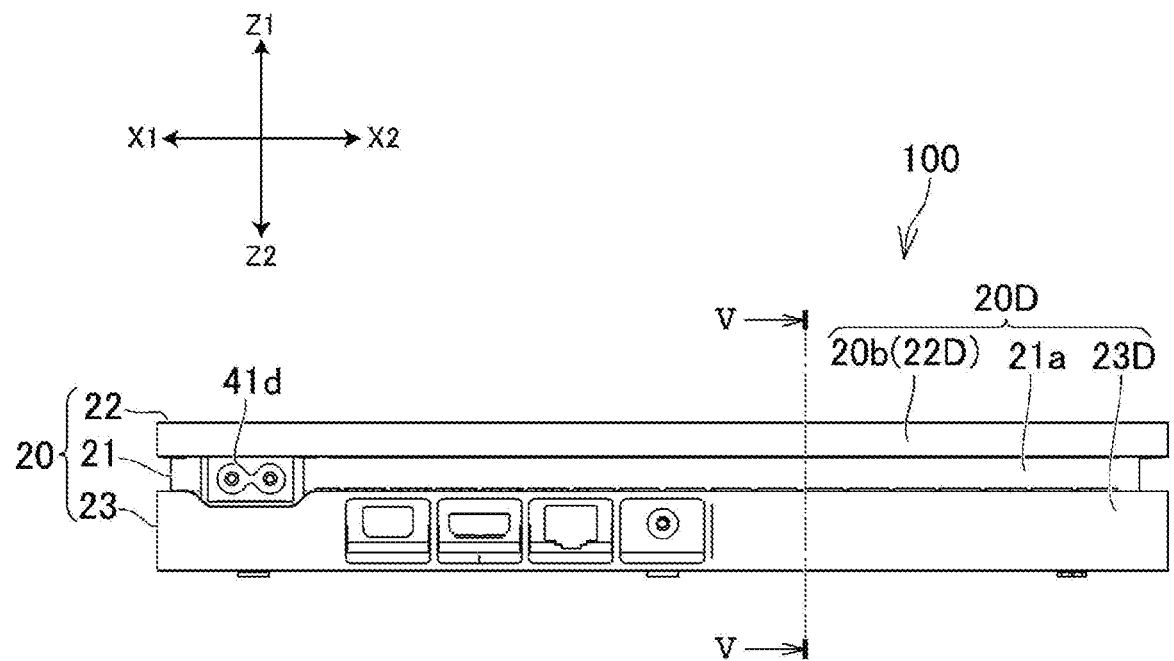
FIG. 4 is a back elevation of the electronic apparatus.
Figure 5:
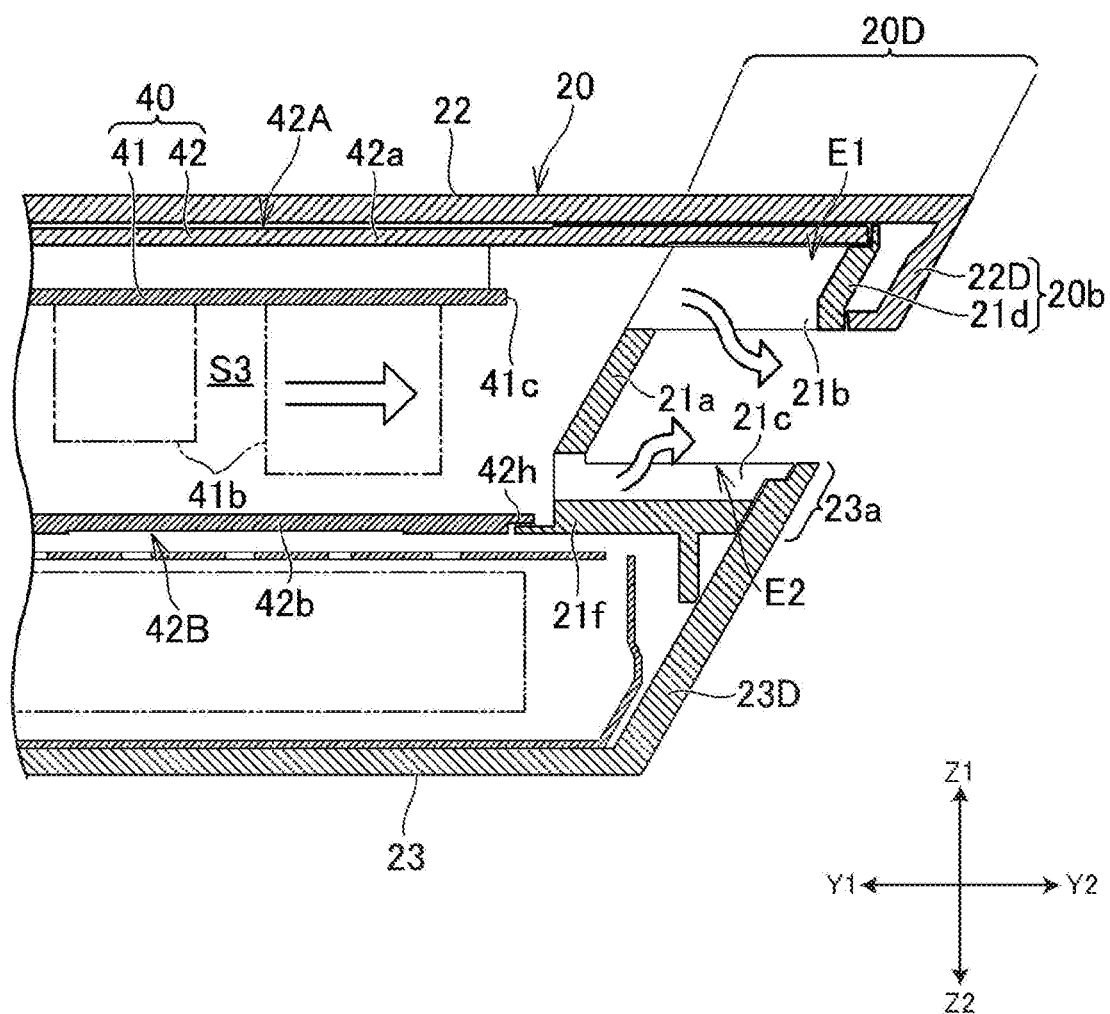
FIG. 5 is a sectional view taken along line V-V of FIG. 4.
Figure 6:
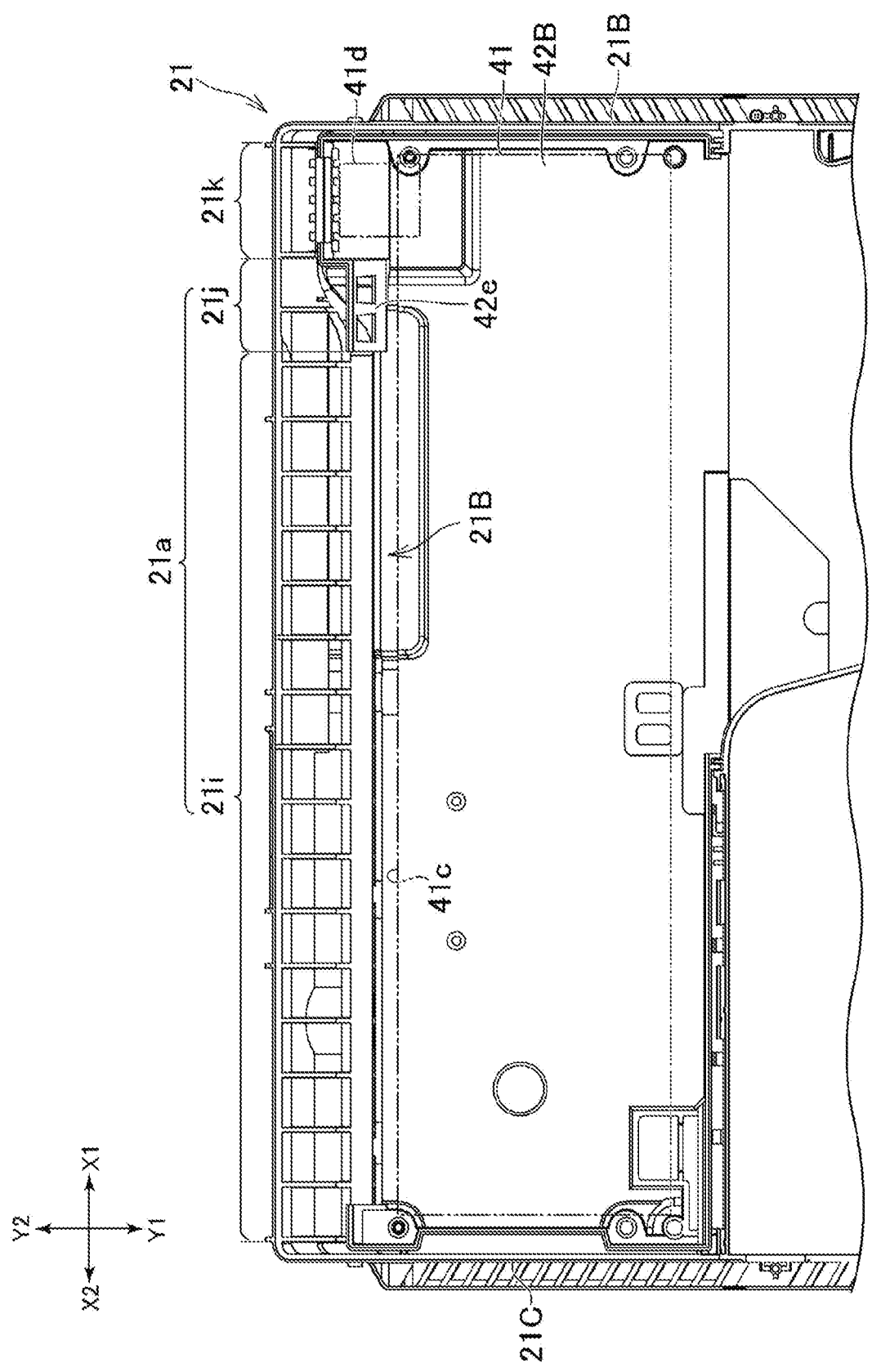
FIG. 6 is a plan view depicting an armor frame and a lower case of a power source unit.

The power source circuit 41 has a power source inlet 41d for connection with an external power source (for example, home power source) through a cable (see FIGS. 4 and 6). As depicted in FIG. 7, the rear wall section 20D of the armor member 20 is formed with an inlet opening 21h for exposing the power source inlet 41d. In the example of the electronic apparatus 100, the inlet opening 21h is formed at a right end portion of the rear wall section 21D of the armor frame 21. The armor frame 21 has, at its right end portion, a wall section 21k formed with the inlet opening 21h (In the following, the wall section 21k will be referred to as the "inlet wall section."). The inlet wall section 21k is located on the right side of the aforementioned first wall section 21a for forming the exhaust hoes E1 and E2. In addition, the inlet wall section 21k is located on the rear side relative to the first wall section 21a. This structure facilitates the user's work of connecting a plug of a cable extending from the external power source to the power source inlet 41d. In the example of the electronic apparatus 100, the position of the inlet wall section 21k in the front-rear direction substantially coincides with the position of the wall section 21d (see FIG. 5) constituting the aforementioned second wall section 20b. The case 42 of the power source unit 40 has an accommodation section 42i (see FIG. 9) that projects rearward and accommodates the power source inlet 41d. The accommodation section 42i is also formed with an opening 42j for exposing the power source inlet 41d to the rear side.

Figure 9:
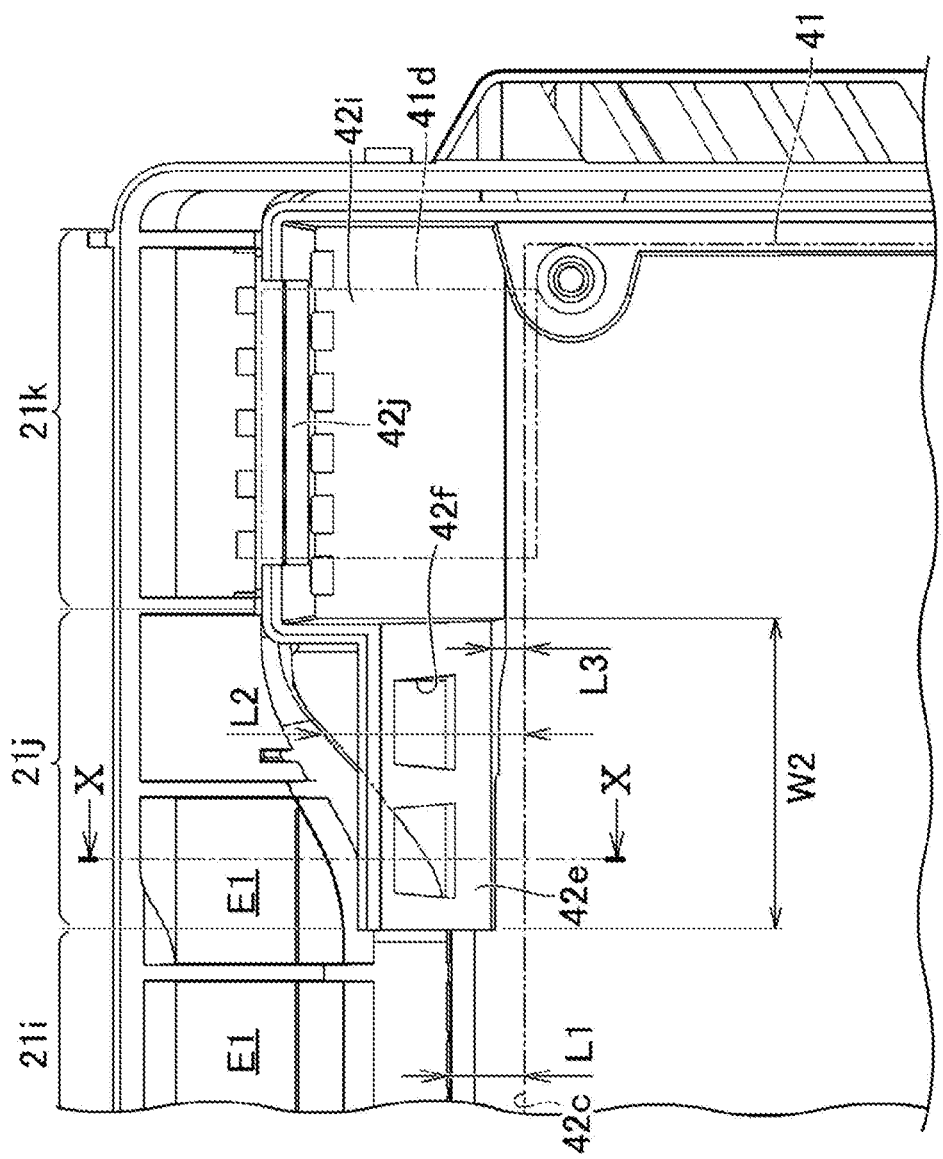
FIG. 9 is an enlarge view of FIG. 6.

As illustrated in FIG. 8, the first wall section 21a has a rectilinear wall section 21i and an inclined wall section 21j. The rectilinear wall section 21i extends rectilinearly in the left-right direction. The inclined wall section 21j extends rightward and rearward from the rectilinear wall section 21i, and is connected to the inlet wall section 21k. Therefore, as depicted in FIG. 9, the inclined wall section 21j is located on the rear side relative to the rectilinear wall section 21i. In the example of the electronic apparatus 100, the inclined wall section 21j extends rightward while curving rearward from the rectilinear wall section 21i.

As illustrated in FIG. 9, the circuit board 41 of the power source unit 40 has a part located on the front side of the rectilinear wall section 21i, the inclined wall section 21j, and the inlet wall section 21k. The rear edge 41c of the circuit board 41 is formed rectilinearly along the left-right direction. Therefore, a distance L2 from the rear edge 41c to the inclined wall section 21j is larger than a distance L1 from the rear edge 41c to the rectilinear wall section 21i. Similarly, the distance from the rear edge 41c to the inlet wall section 21k is also larger than the distance L1 from the rear edge 41c to the rectilinear wall section 21i. In the example of the electronic apparatus 100, the inclined wall section 21j extends obliquely rightward and rearward, and, therefore, the distance L2 gradually increases in going rightward.

[Inner Wall Section]

Figure 10:
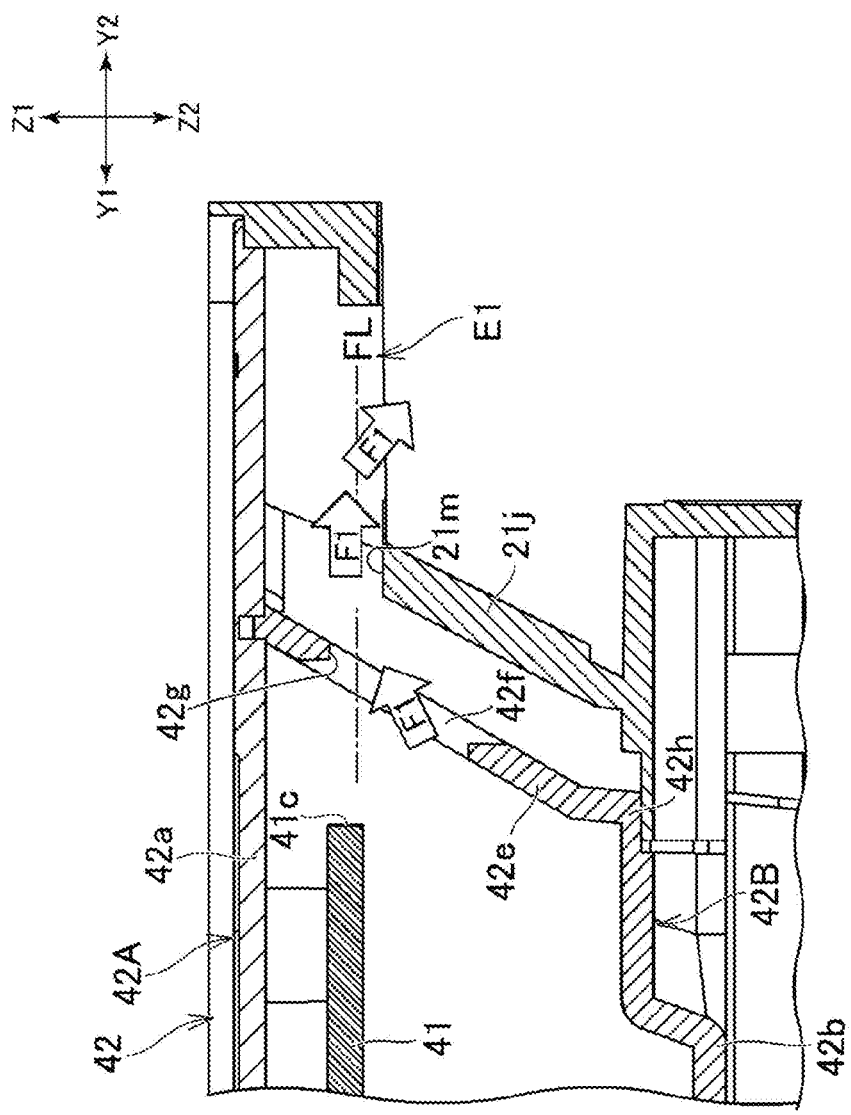
FIG. 10 is a sectional view taken along line X-X of FIG. 9.

An inner wall section 42e (see FIGS. 8 and 9) is located between the inclined wall section 21j and the rear edge 41c of the circuit board 41, in plan view. In the example of the electronic apparatus 100, as depicted in FIG. 10, in sectional view, the inner wall section 42e is located between the inclined wall section 21j and the rear edge 41c of the circuit board 41. Therefore, the circuit board 41 is located on the front side of the inner wall section 42e. The position of the circuit board 41 is lower than the upper end of the inner wall section 42e, and is higher than the lower end of the inner wall section 42e. In addition, the inner wall section 42e is located on the front side of the inclined wall section 21j. In other words, when the inner wall section 42e is viewed in front view, the inner wall section 42e and the inclined wall section 21j overlap with each other. As a result, limitations on design due to the formation of the inclined wall section 21j (limitations due to the rearward inclination of a part of the rear wall section 20D of the armor member 20) can be mitigated by the inner wall section 42e. As a result, adoption of a design in which a part of the rear wall section 20D is inclined is facilitated.

Note that a width W2 (see FIG. 9) of the inner wall section 42e in the left-right direction coincides substantially with the width of the inclined wall section 21j. Therefore, the inner wall section 42e is not located on the front side of the rectilinear wall section 21i of the first wall section 21a. More in detail, in front view of the inner wall section 42e, the inner wall section 42e does not have any part that overlaps with the rectilinear wall section 21i. Unlike in the example of the electronic apparatus 100, a part of the inner wall section 42e may overlap with a part of the rectilinear wall section 21i, in front view. For example, a part of the inner wall section 42e may overlap with that part of the rectilinear wall section 21i which is near the inclined wall section 21j (for example, a part smaller than one half the rectilinear wall section 21i), in front view.

The inner wall section 42e is a member formed separately from the rear wall section 20D which is formed with the exhaust holes E1 and E2. More in detail, the inner wall section 42e is a member formed separately from the armor member 20. As illustrated in FIG. 10, in the example of the electronic apparatus 100, the inner wall section 42e is a part of the case 42 of the power source unit 40. More specifically, the inner wall section 42e is a part formed integrally with the lower case 42B. This structure makes it possible to dispose the inner wall section 42e between the inclined wall section 21j and the circuit board 41, without increasing the number of component parts of the electronic apparatus 100. Note that "the inner wall section 42e is formed separately from the armor member 20" means that the member having the inner wall section 42e (in the example of the electronic apparatus 100, the case 42) is formed by a mold different from the mold used for molding the members constituting the armor member 20 (in the example of the electronic apparatus 100, the armor frame 21, the upper armor cover 22, and the lower armor cover 23).

In the example of the electronic apparatus 100, as depicted in FIG. 10, the inner wall section 42e extends upward from the rear edge 42h of the lower wall section 42b of the lower case 42B. An upper edge of the inner wall section 42e reaches the upper wall section 42a of the upper case 42A. More in detail, the upper edge of the inner wall section 42e is caught on the upper wall section 42a.

In the example of the electronic apparatus 100, a distance L3 (see FIG. 9) between the inner wall section 42e and the rear edge 41c of the circuit board 41 is smaller than the distance (see FIG. 9) between the rear edge 41c of the circuit board 41 and the rectilinear wall section 21i of the first wall section 21a. The distance L3 is, for example, smaller than the distance L1 by the thickness of the inner wall section 42e. The position of the inner wall section 42e is not limited to that in the example of the electronic apparatus 100. For example, the distance L3 may be same as the distance L1.

As illustrated in FIG. 9, the inner wall section 42e is formed along the left-right direction, and is disposed in parallel to the first wall section 21a. Therefore, the inclined wall section 21j is inclined rearward in relation to the inner wall section 42e. As aforementioned, the first wall section 21a (see FIG. 5) is inclined such that its upper edge is located on the rear side relative to its lower edge. As depicted in FIG. 10, the inner wall section 42e is also inclined, like the first wall section 21a, such that its upper edge is located on the rear side relative to its lower edge. The posture of the inner wall section 42e is not limited to that in the example of the electronic apparatus 100. In other words, the inner wall section 42e may be formed in parallel to the vertical direction.

As depicted in FIG. 10, the exhaust holes E1 are located on the rear side of the inner wall section 42e. The inner wall section 42e is formed with a through-hole 42f which penetrates the inner wall section 42e. According to this structure, air F1 can pass through the through-hole 42f and can be discharged via the exhaust holes E1, and, therefore, cooling performance of the electronic apparatus 100 can be enhanced, as compared to a structure in which such a through-hole 42f is absent. In the example of the electronic apparatus 100, the inner wall section 42e is formed with two through-holes 42f aligned in the left-right direction (see FIG. 9). The through-hole 42f on one side (the hole 42f on the left side in FIG. 9) is located on the front side of the exhaust hole E1 (the exhaust hole E1 located at the right end). Unlike in the example of the figure, the exhaust hole E1 maybe formed also on the rear side of the through-hole 42f on the right side. As a further example, the inner wall section 42e may not necessarily be formed with the through-holes 42f. As another example, the exhaust hole E1 may not necessarily be formed on the rear side of the inner wall section 42e.

Note that as depicted in FIG. 10, an upper edge 42g of the through-hole 42f is located at a position higher than an upper edge 21m of the inclined wall section 21j. In other words, a straight line FL along the front-rear direction can pass through the inside of the through-hole 42f in the inner wall section 42e to reach the exhaust hole E1. As a result, it is easy for air F1 having passed through the through-hole 42f in the inner wall section 42e to be discharged through the exhaust holes E1. Note that as illustrated in FIG. 10, in the example of the electronic apparatus 100, while the exhaust holes E1 are formed on the rear side of the inclined wall section 21j, the exhaust holes E2 are not formed there. Unlike in the example of the electronic apparatus 100, both the exhaust holes E1 and E2 may be formed on the rear side of the inclined wall section 21j.

In addition, as depicted in FIG. 10, the inner wall section 42e is close to the inclined wall section 21j, and no other part is present between the inner wall section 42e and the inclined wall section 21j. In other words, a straight line along the front-rear direction intersecting the inner wall section 42e does not intersect other parts or members between the inner wall section 42e and the inclined wall section 21j. Therefore, air having passed through the holes 42f in the inner wall section 42e can smoothly flow to the exhaust holes E1.

[Air Flow Path]

Figure 3:
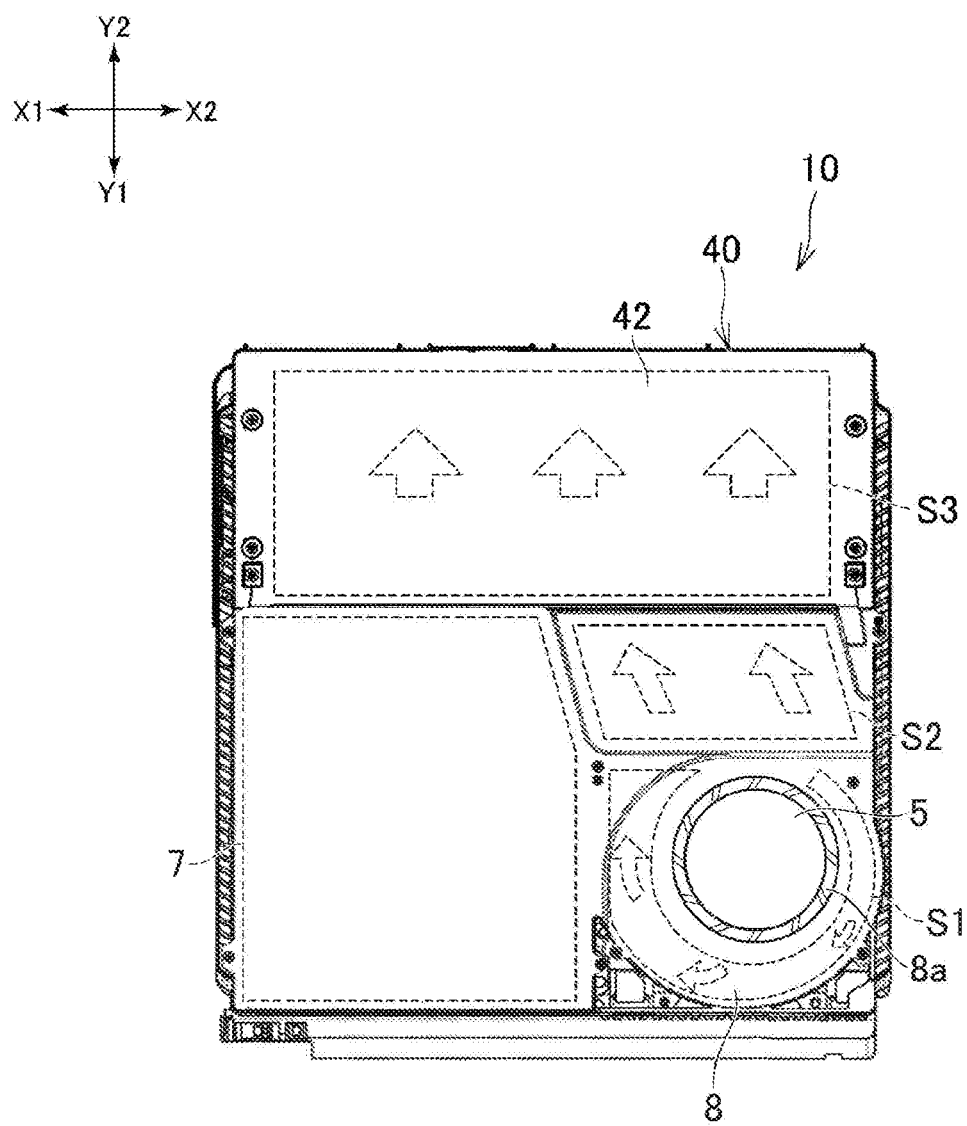
FIG. 3 is a plan view of an apparatus main body constituting the electronic apparatus.

An air flow path extending from the intake holes to the air flow path S3 configured by the case 42 will be described. In the example of the electronic apparatus 100, a side surface of the electronic apparatus 100 is formed with the intake holes A (see FIG. 1). As depicted in FIG. 3, the cooling fan 5 is covered with the cover 8. The cover 8 is formed with an opening 8a located on the upper side of the cooling fan 5. When the cooling fan 5 is driven, air introduced from the exterior via the intake holes A flows from the upper side of the cooling fan 5 into the cooling fan 5 through the opening 8a. In addition, the air introduced from the exterior via the intake holes A passes on the lower side of the apparatus main body 10, and flows from the lower side of the cooling fan 5 into the cooling fan 5. The apparatus main body 10 has, in the inside thereof, air flow paths S1 and S2 formed downstream of the cooling fan 5, in addition to the aforementioned air flow path S3. The air flow paths S1 and S2 are partitioned from other regions of the apparatus main body 10 by the cover, case and wall members. The air flow path S1 is formed in the periphery of the cooling fan 5. The air flow path S2 extends rearward from the air flow path S1, and is located on the rear side of the cooling fan 5. Heat sinks in contact with the integrated circuits such as, for example, the CPU and the GPU are disposed in the air flow path S2. The air flow path S3 configured by the case 42 extends rearward from the air flow path S2, and is spreading in the left-right direction.

SUMMARY

As aforementioned, the electronic apparatus 100 includes the circuit board 41, and the armor member 20 having the rear wall section 20D that is located on the rear side relative to the circuit board 41 and that is formed with the exhaust holes E1. The circuit board 41 has the rear edge 41c along the rear wall section 20D, on the side of the rear wall section 20D. The rear wall section 20D includes the rectilinear wall section 21i spaced rearward from the rear edge 41c of the circuit board 41, and the inclined wall section 21j located on the rear side relative to the rectilinear wall section 21i. The inner wall section 42e is located between the rear wall section 20D and the rear edge 41c of the circuit board 41. The inner wall section 42e is located between the inclined wall section 21j and the rear edge 41c of the circuit board 41, and is not located between the rectilinear wall section 21i and the rear edge 41c of the circuit board 41. As a result, limitations on design due to the formation of the armor member 20 with the inclined wall section 21j (limitations due to rearward inclination of a part of the rear wall section 20D of the armor member 20) can be mitigated by the inner wall section 42e. As a result, adoption of a design in which a part of the rear wall section 20D is inclined is facilitated.

MODIFICATIONS

Note that the electronic apparatus proposed in the present disclosure is not limited to the aforementioned electronic apparatus 100.

For example, the rear wall section 20D of the armor member 20 may have a part which is formed along the left-right direction like the rectilinear wall section 21i and which is located on the rear side relative to the rectilinear wall section 21i, in place of the inclined wall section 21j. Besides, the inner wall section 42e may be located between this part of the rear wall section 20D and the rear edge 41c of the circuit board 41.

The inner wall section 42e may be formed in a member different from the case 42. The inner wall section 42e may be formed integrally with such a member as, for example, the armor frame 21 or the lower armor cover 23.

The circuit board 41 disposed along the rear wall section 20D may not necessarily be a circuit board constituting the power source unit 40. For example, the circuit board 41 may be a main substrate of the electronic apparatus 100 (a substrate on which the CPU and the like are mounted).

The rear wall section 20D having the inclined wall section 21j may be formed not with the exhaust holes E1 and E2 but with the intake holes. In other words, the structure of the inner wall section 42e and the inclined wall section 21j may be applied to a wall section formed with the intake holes.

In addition, the inclined wall section 21j has been a wall section that connects the inlet wall section 21k and the rectilinear wall section 21i. The position of the inclined wall section 21j is not limited to this one. In other words, the inclined wall section 21j may be formed at a position different from that of the inlet wall section 21k. Besides, the inner wall section 42e may be formed on the front side of the inclined wall section 21j.

The invention claimed is:

1. An electronic apparatus comprising:
a circuit board; and
an armor member having a vent hole wall that is located in a first direction relative to the circuit board and that is formed with a plurality of vent holes,
wherein the circuit board has an edge along the vent hole wall, on a side of the vent hole wall,
the vent hole wall includes a first wall section spaced in the first direction from the edge of the circuit board, and a second wall section located in the first direction relative to the first wall section, and
an inner wall section is located between the second wall section and the edge of the circuit board, and the inner wall section is not located between at least a part of the first wall and the edge of the circuit board.

2. The electronic apparatus according to claim 1, wherein the inner wall section is formed with a hole penetrating in the first direction.

3. The electronic apparatus according to claim 1, wherein the second section is formed with part of the plurality of vent holes, and
the inner wall section is formed with a hole penetrating in the first direction.

4. The electronic apparatus according to claim 1, further comprising:
a case for accommodating the circuit board,
wherein the inner wall section is a part of the case.

5. The electronic apparatus according to claim 1, wherein the second wall section is connected to the first wall section, and is curved toward the first direction from the first wall section.

\* \* \* \* \*